United States Patent
Wen et al.

(10) Patent No.: US 11,950,355 B2
(45) Date of Patent: Apr. 2, 2024

(54) FLEXIBLE CIRCUIT BOARD AND MANUFACTURING METHOD THEREFOR, AND RELATED APPARATUS

(71) Applicants: Chengdu BOE Optoelectronics Technology Co., Ltd., Sichuan (CN); BOE Technology Group Co., Ltd., Beijing (CN)

(72) Inventors: Hui Wen, Beijing (CN); Lianbin Liu, Beijing (CN); Hengzhen Liang, Beijing (CN); Xu Lu, Beijing (CN); Zhaolun Liu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 234 days.

(21) Appl. No.: 17/762,682

(22) PCT Filed: May 12, 2021

(86) PCT No.: PCT/CN2021/093299
§ 371 (c)(1),
(2) Date: Mar. 22, 2022

(87) PCT Pub. No.: WO2021/244245
PCT Pub. Date: Dec. 9, 2021

(65) Prior Publication Data
US 2022/0418091 A1  Dec. 29, 2022

(30) Foreign Application Priority Data
Jun. 5, 2020 (CN) .......................... 202010506523.9

(51) Int. Cl.
*H05K 1/02* (2006.01)

(52) U.S. Cl.
CPC ......... *H05K 1/0219* (2013.01); *H05K 1/0224* (2013.01); *H05K 1/028* (2013.01)

(58) Field of Classification Search
CPC .................................................... H05K 1/0224
See application file for complete search history.

(56) References Cited

U.S. PATENT DOCUMENTS

| 2015/0034364 A1 | 2/2015 | Ho et al. |
| 2019/0008033 A1* | 1/2019 | Chung ................... H05K 1/118 |

(Continued)

FOREIGN PATENT DOCUMENTS

| CN | 104349575 A | 2/2015 |
| CN | 204906843 U | 12/2015 |

(Continued)

*Primary Examiner* — Hung V Ngo
(74) *Attorney, Agent, or Firm* — IPro, PLLC (57) ABSTRACT

The flexible circuit board includes: a substrate layer; a first conductive layer; a second conductive layer; a first cover film, a second cover film, a first electromagnetic shielding layer, and a second electromagnetic shielding layer. The part of the first cover film overlapping a first conductive portion has first hollow portions. The part of the second cover film overlapping a second conductive portion has second hollow portions. The orthographic projection of each first hollow portion on the substrate layer has an overlapping area with the orthographic projection of at least one second hollow portion on the substrate layer. The first electromagnetic shielding layer is coupled to the first conductive portion through the first hollow portions. The second electromagnetic shielding layer is coupled to the second conductive portion through the second hollow portions.

16 Claims, 10 Drawing Sheets

(56) References Cited

U.S. PATENT DOCUMENTS

| | | | |
|---|---|---|---|
| 2020/0137882 A1* | 4/2020 | Coakley | H05K 1/118 |
| 2022/0210917 A1* | 6/2022 | Liu | G01L 9/12 |
| 2022/0256690 A1* | 8/2022 | Gong | H05K 1/0218 |
| 2022/0386449 A1* | 12/2022 | Gong | H05K 1/0216 |
| 2023/0164907 A1* | 5/2023 | Li | H05K 1/0218 345/174 |

FOREIGN PATENT DOCUMENTS

| | | |
|---|---|---|
| CN | 204968221 U | 1/2016 |
| CN | 109496063 A | 3/2019 |
| CN | 212910167 U | 4/2021 |
| JP | 2013157566 A | 8/2013 |

* cited by examiner

FLEXIBLE CIRCUIT BOARD AND MANUFACTURING METHOD THEREFOR, AND RELATED APPARATUS

CROSS REFERENCE TO RELATED APPLICATIONS

The present application is a national phase entry under 35 U.S.C. § 371 of International Application No. PCT/CN2021/093299, filed on May 12, 2021, which claims priority of Chinese Patent Application No. 202010506523.9, filed with the China National Intellectual Property Administration (CNIPA) on Jun. 5, 2020, and entitled "FLEXIBLE CIRCUIT BOARD AND MANUFACTURING METHOD THEREFOR, AND RELATED APPARATUS, the entire content of which is incorporated herein by reference.

FIELD

The present disclosure relates to the technical field of circuit boards, in particular to a flexible circuit board and a method for preparing the flexible circuit board, and a related apparatus.

BACKGROUND

Flexible circuit boards (Flexible printed circuits (FPCs)) are highly reliable and excellent flexible printed circuit boards made of polyimide or polyester films as base materials, have the advantages of high wiring density, light height, low thickness and good bendability, and are mainly used in many products such as mobile phones, notebook computers, PADs, digital cameras, and LCMs.

SUMMARY

A flexible circuit board provided by embodiments of the present disclosure, includes:
 a substrate layer;
 a first conductive layer, located on a first surface of the substrate layer, the first conductive layer including a plurality of first traces and a first conductive portion, and the first conductive portion being insulated from the first traces and being grounded;
 a second conductive layer, located on a second surface of the substrate layer opposite to the first surface, the second conductive layer including a plurality of second traces and a second conductive portion, and the second conductive portion being insulated from the second traces and being grounded;
 a first cover film, located on a side of the first conductive layer facing away from the substrate layer, a part of the first cover film overlapping the first conductive portion having a plurality of first hollow portions;
 a second cover film, located on a side of the second conductive layer facing away from the substrate layer, a part of the second cover film overlapping the second conductive portion having a plurality of second hollow portions, and an orthographic projection of each of the first hollow portions on the substrate layer having an overlapping area with an orthographic projection of at least one of the second hollow portions on the substrate layer;
 a first electromagnetic shielding layer, located on a side of the first cover film facing away from the substrate layer, the first electromagnetic shielding layer being coupled to the first conductive portion through the first hollow portions; and
 a second electromagnetic shielding layer, located on a side of the second cover film facing away from the substrate layer, the second electromagnetic shielding layer being coupled to the second conductive portion through the second hollow portions.

Optionally, in the above flexible circuit board provided by the embodiments of the present disclosure, the orthographic projection of at least one of the second hollow portions on the substrate layer has the overlapping area with the orthographic projection of two adjacent first hollow portions on the substrate layer.

Optionally, in the above flexible circuit board provided by the embodiments of the present disclosure, the orthographic projection of each of the first hollow portions on the substrate layer only has the overlapping area with the orthographic projection of only one of the second hollow portions on the substrate layer.

Optionally, in the above flexible circuit board provided by the embodiments of the present disclosure, the first hollow portions correspond to the second hollow portions in a one-to-one mode.

Optionally, in the above flexible circuit board provided by the embodiments of the present disclosure, the orthographic projections of the first hollow portions on the substrate layer and the orthographic projections of the second hollow portions on the substrate layer completely overlap.

Optionally, in the above flexible circuit board provided by the embodiments of the present disclosure, the orthographic projections of the first hollow portions on the substrate layer and the orthographic projections of the second hollow portions on the substrate layer only partially overlap.

Optionally, in the above flexible circuit board provided by the embodiments of the present disclosure, sizes of the first hollow portion and the second hollow portion are the same.

Optionally, in the above flexible circuit board provided by the embodiments of the present disclosure, an area of the overlapping area accounts for 50% to 90% of an area of the orthographic projection of the at least one second hollow portion on the substrate layer.

Optionally, in the above flexible circuit board provided by the embodiments of the present disclosure, the first conductive portion surrounds all the first traces, and the second conductive portion surrounds all the second traces.

Optionally, in the above flexible circuit board provided by the embodiments of the present disclosure, an orthographic projection of the first conductive portion on the substrate layer coincides with an orthographic projection of the second conductive portion on the substrate layer.

Optionally, in the above flexible circuit board provided by the embodiments of the present disclosure, both the first conductive layer and the second conductive layer include first binding areas and second binding areas, the first binding areas have a plurality of first pads, the second binding areas have a plurality of second pads, two ends of the first trace are electrically connected with the corresponding first pad and second pad in the first conductive layer respectively, and two ends of the second trace are electrically connected with the corresponding first pad and second pad in the second conductive layer respectively.

The respective first hollow portions are arranged in an extending direction of the first trace, and the respective second hollow portions are arranged in an extending direction of the second trace.

Optionally, in the above flexible circuit board provided by the embodiments of the present disclosure, the first hollow portion is of a rectangular structure, and a width of the first hollow portion in the extending direction of the first trace is greater than a width of the first hollow portion in a direction perpendicular to the extending direction of the first trace.

Optionally, in the above flexible circuit board provided by the embodiments of the present disclosure, the first hollow portions and the second hollow portions of which the orthographic projections on the substrate layer have the overlapping area are arranged in the extending direction of the first trace.

Based on the same inventive concept, embodiments of the present disclosure also provide an array substrate, including the above flexible circuit board.

Based on the same inventive concept, embodiments of the present disclosure also provide a display device, including the above array substrate.

Based on the same inventive concept, embodiments of the present disclosure also provide a method for preparing a flexible circuit board, including:

forming a first conductive layer on a first surface of a substrate layer, the first conductive layer including a plurality of first traces and a first conductive portion insulated from the first traces and being grounded;

forming a second conductive layer on a second surface of the substrate layer opposite to the first surface, the second conductive layer including a plurality of second traces and a second conductive portion insulated from the second traces and being grounded;

forming a first cover film on a side of the first conductive layer facing away from the substrate layer, a part of the first cover film overlapping the first conductive portion having a plurality of first hollow portions;

forming a second cover film on a side of the second conductive layer facing away from the substrate layer, a part of the second cover film overlapping the second conductive portion having a plurality of second hollow portions; wherein, an orthographic projection of each of the first hollow portions on the substrate layer at least has an overlapping area with an orthographic projection of one of the second hollow portions on the substrate layer;

forming a first electromagnetic shielding layer on a side of the first cover film facing away from the substrate layer, the first electromagnetic shielding layer being coupled to the first conductive portion through the first hollow portions; and forming a second electromagnetic shielding layer on a side of the second cover film facing away from the substrate layer, the second electromagnetic shielding layer being coupled to the second conductive portion through the second hollow portions.

DETAILED DESCRIPTION OF THE EMBODIMENTS

In order to enable objectives, technical solutions, and advantages of embodiments of the present disclosure to be clearer, the technical solutions of the embodiments of the present disclosure will be described in further detail below with reference to the accompanying drawings of the embodiments of the present disclosure. Apparently, the described embodiments are merely some, but not all embodiments of this disclosure. Also, the embodiments and features in the embodiments of the present disclosure may be combined with one another in case of no conflict. Based on the described embodiments in the present disclosure, all other embodiments obtained by those ordinarily skilled in the art without involving any inventive effort are within the protection scope of the present disclosure.

Unless defined otherwise, technical or scientific terms used in the present disclosure shall have the ordinary meaning as understood by those ordinarily skilled in the art to which the present disclosure belongs. The terms "first", "second", and similar referents used in the present disclosure do not denote any order, quantity, or importance, but rather are used solely to distinguish one from another. The word "include" or "comprise", and the like, means that an element or article that precedes the word is inclusive of the element or article listed after the word and equivalents thereof, but does not exclude other elements or articles. The terms "connection" or "connected", and the like, are not limited to physical or mechanical connections, but may include electrical connections, whether direct or indirect. The terms "inner", "outer", "upper", "lower", and the like are used merely to denote a relative positional relationship that may change accordingly when the absolute position of an object being described changes.

It should be noted that the dimensions and shapes of various figures in the accompanying drawings are not to truly scale and are intended to be merely illustrative of the present disclosure. The same or similar reference numerals refer to the same or similar components or components having the same or similar functions throughout.

Figure 1A:
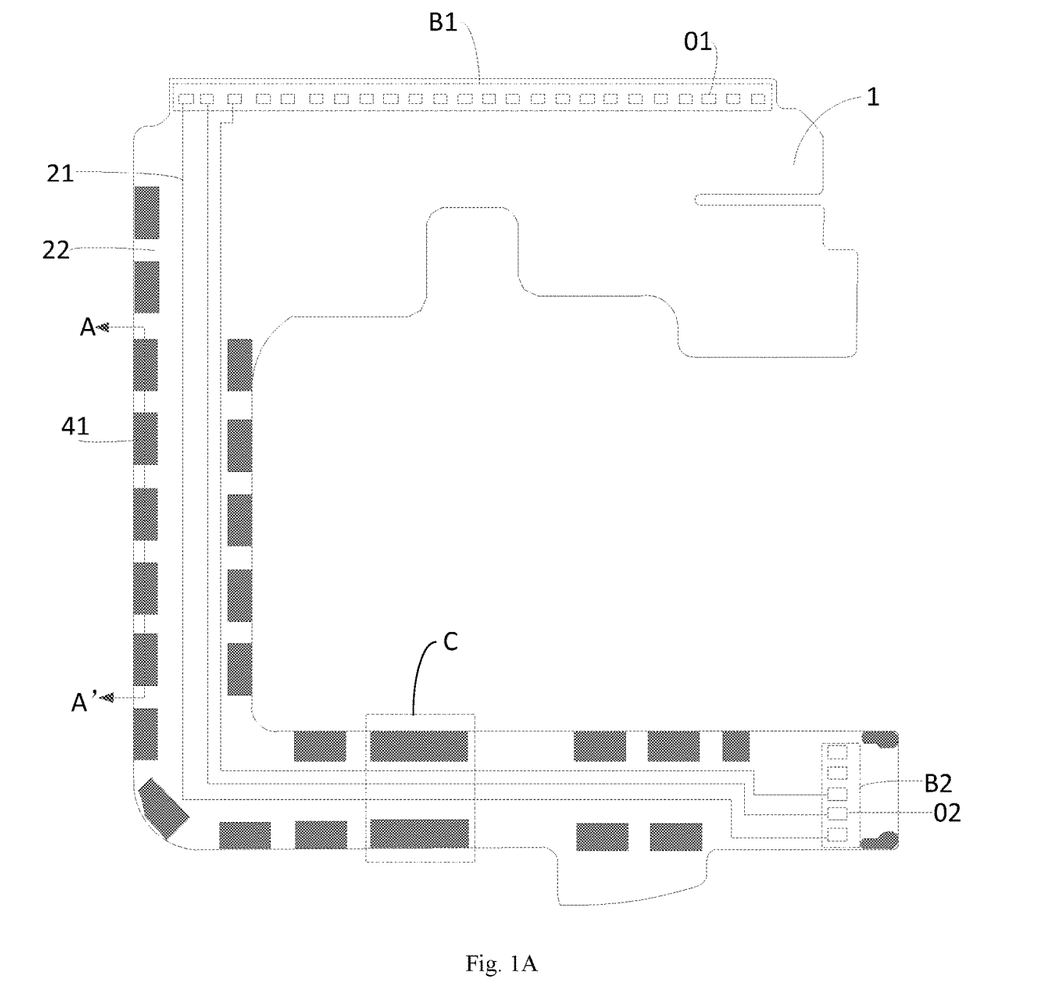
FIG. 1A and FIG. 1B are top-view structure schematic diagrams of a top surface and a bottom surface of a flexible circuit board provided by an embodiment of the present disclosure respectively.
Figure 1B:
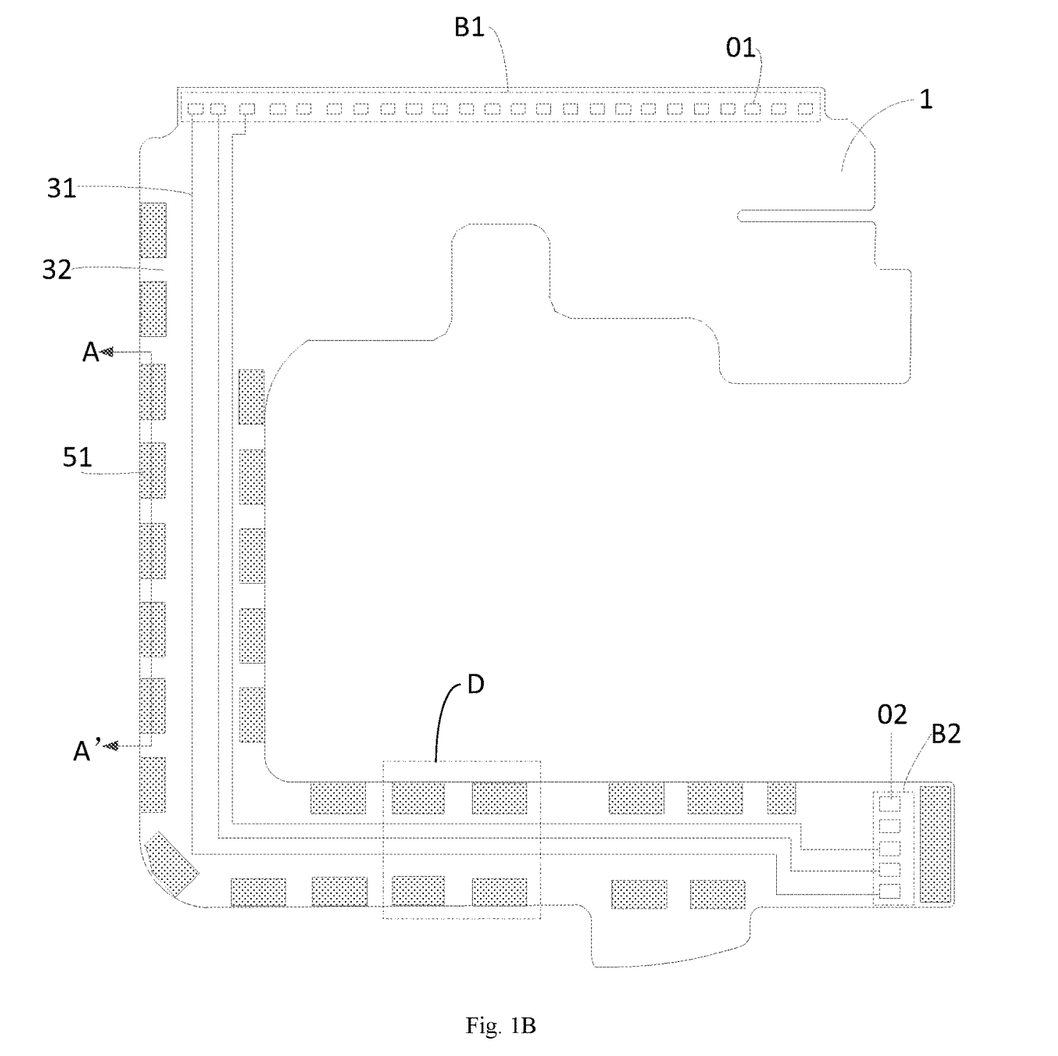
Figure 2:
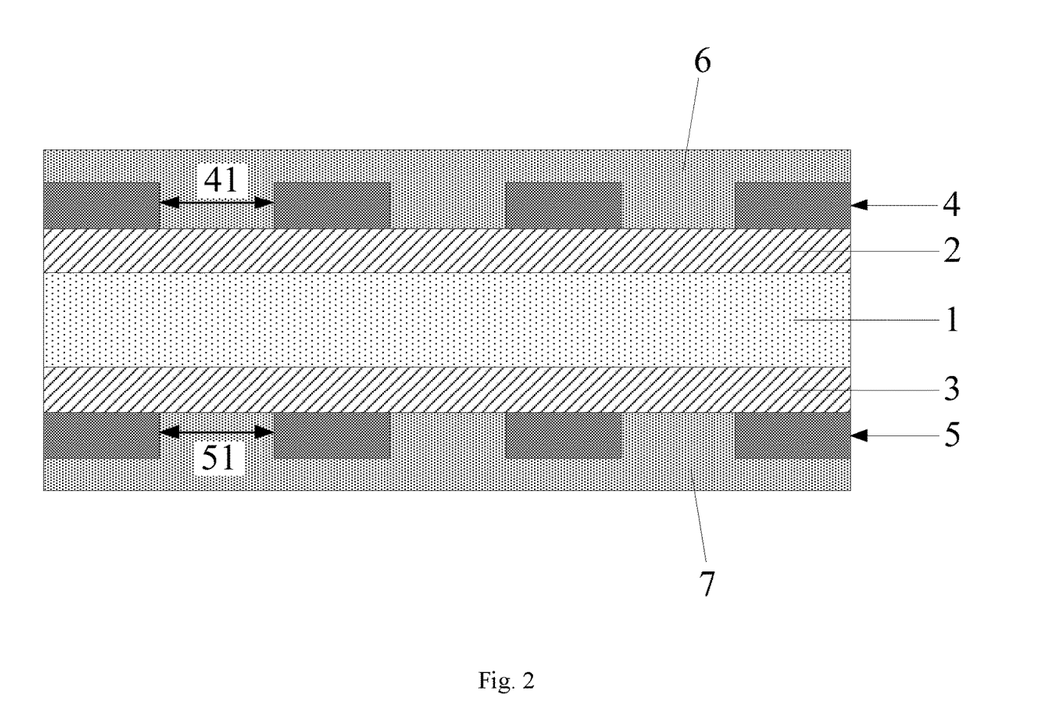
FIG. 2 is an overall sectional structure schematic diagram in an AA' direction in FIG. 1A and FIG. 1B.
Figure 3:
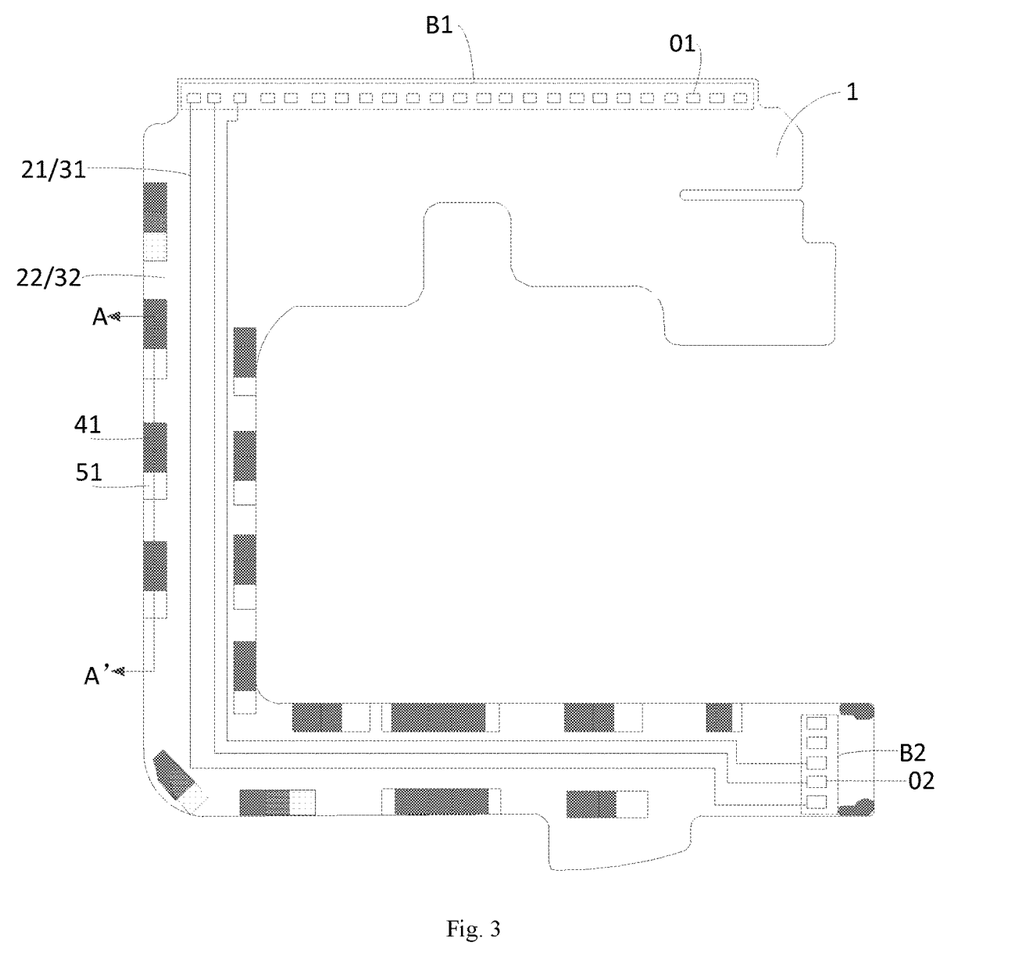
FIG. 3 is another top-view structure schematic diagram of a flexible circuit board provided by an embodiment of the present disclosure.
Figure 4:
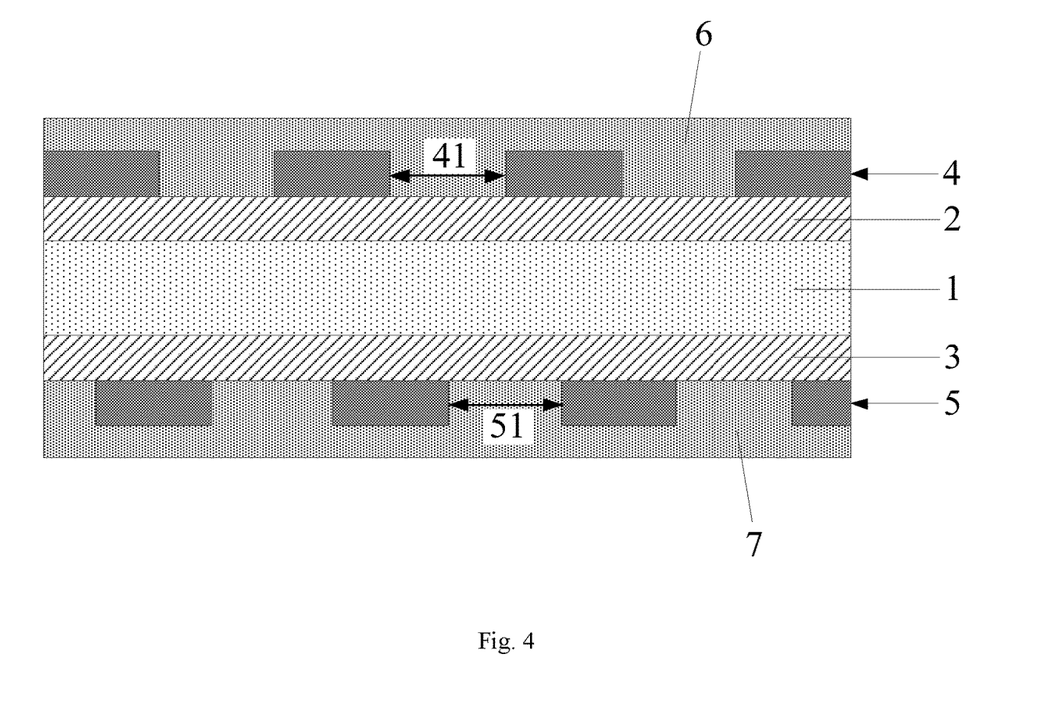
FIG. 4 is a sectional structure schematic diagram of FIG. 3 in an AA' direction.
Figure 5:
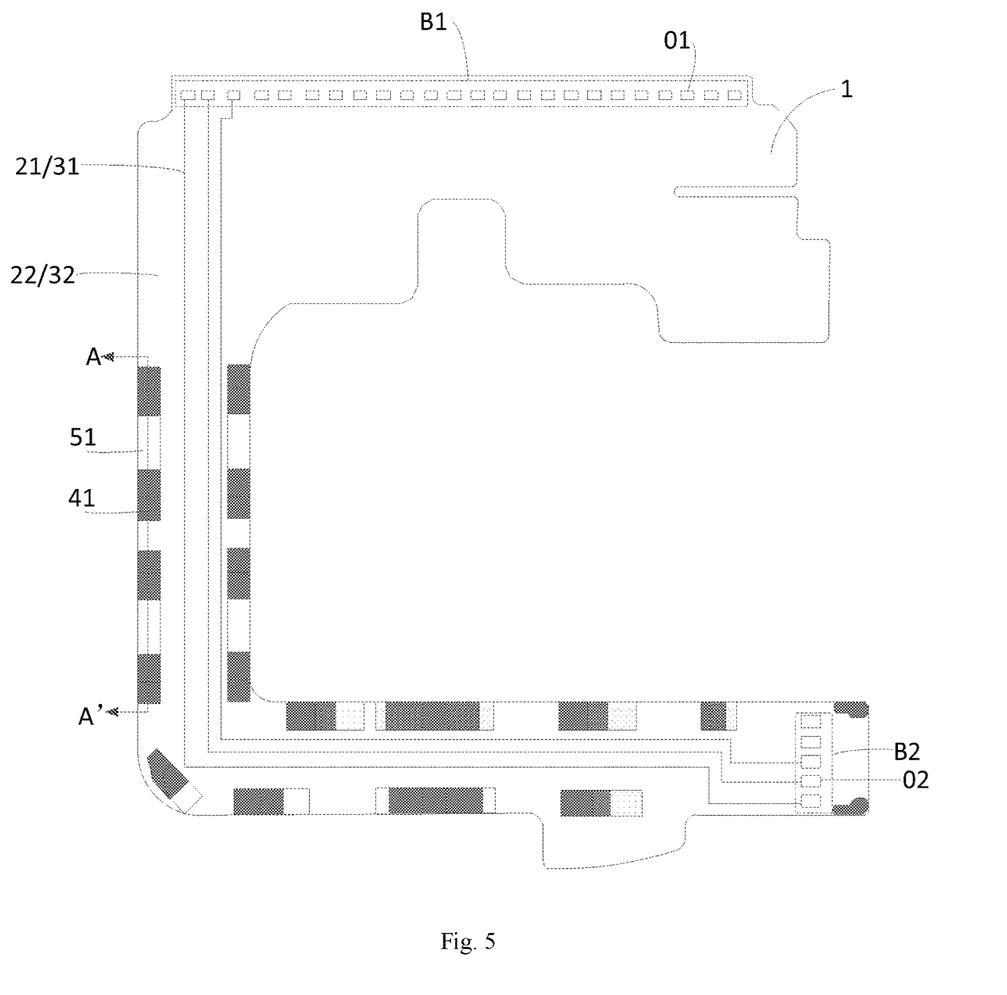
FIG. 5 is another top-view structure schematic diagram of a flexible circuit board provided by an embodiment of the present disclosure.
Figure 6:
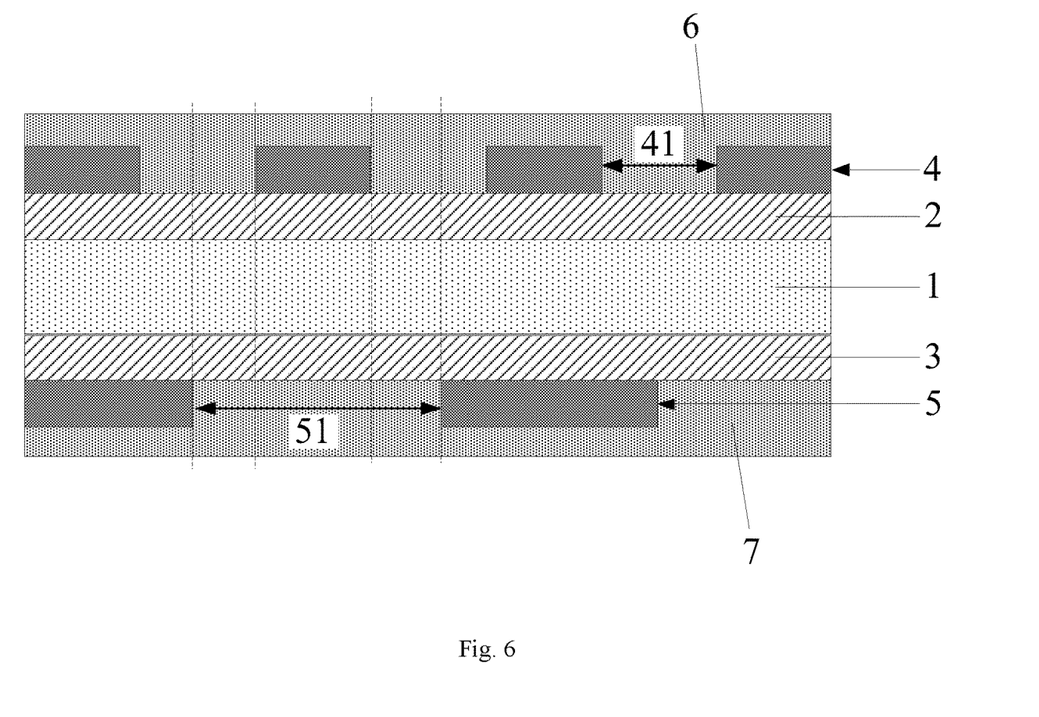
FIG. 6 is a sectional structure schematic diagram of FIG. 5 in an AA' direction.

A flexible circuit board provided by embodiments of the present disclosure is as shown in FIG. 1A, FIG. 1B, FIG. 2, FIG. 3, FIG. 4, FIG. 5 and FIG. 6. FIG. 1A, FIG. 1B, FIG. 3 and FIG. 5 are top-view structure schematic diagrams of the flexible circuit board respectively. FIG. 1A and FIG. 1B are top-view structure schematic diagrams of two opposite surfaces of the flexible circuit board respectively. FIG. 2 is an overall sectional structure schematic diagram of the flexible circuit board in an AA' direction in FIG. 1A and FIG. 1B. FIG. 4 is a sectional structure schematic diagram of FIG. 3 in an AA' direction, and FIG. 6 is a sectional structure schematic diagram of FIG. 5 in an AA' direction. The flexible circuit board may include: a substrate layer 1; a first conductive layer 2 located on a first surface of the substrate layer 1, the first conductive layer 2 including a plurality of first traces 21 and a first conductive portion 22, the first conductive portion 22 being insulated from the first traces 21 and being grounded; a second conductive layer 3 located on a second surface of the substrate layer 1 opposite to the first surface, the second conductive layer 3 including a plurality of second traces 31 and a second conductive portion 32, the second conduction portion 32 being insulated from the second traces 31 and being grounded; a first cover film 4 located on a side of the first conductive layer 2 facing away from the substrate layer 1, the part of the first cover film 4 that overlaps the first conductive portion 22 being provided with a plurality of first hollow portions 41; a second cover film 5 located on a side of the second conductive layer 3 facing away from the substrate layer 1, the part of the second cover film 5 that overlaps the second conductive portion 32 being provided with a plurality of second hollow portions 51, and an orthographic projection of each first hollow portion 41 on the substrate layer 1 having an overlapping area with an orthographic projection of at least one second hollow portion 51 on the substrate layer 1; a first electromagnetic shielding layer 6 located on a side of the first cover film 4 facing away from the substrate layer 1, the first electromagnetic shielding layer 6 being coupled to the first conductive portion 22 through the first hollow portions 41; and a second electromagnetic shielding layer 7 located on a side of the second cover film 5 facing away from the substrate layer 1, the second electromagnetic shielding layer 7 being coupled to the second conductive portion 32 through the second hollow portions 51.

In the above flexible circuit board provided by the embodiments of the present disclosure, the plurality of first hollow portions 41 are provided in the part of the first cover film 4 that overlaps the first conductive portion 22, the plurality of second hollow portions 51 are provided in the part of the second cover film 5 that overlaps the second conductive portion 32, and the orthographic projection of each first hollow portion 41 on the substrate layer 1 has the overlapping area with the orthographic projection of at least one second hollow portion 51 on the substrate layer 1. Therefore, by regularly opening windows (making the hollow portions) in the first cover film 4 and the second cover film 5, when the corresponding first electromagnetic shielding layer 6 and the corresponding second electromagnetic shielding layer 7 are subsequently disposed on both sides of the first cover film 4 and the second cover film 5, the electromagnetic shielding layers are electrically connected to the grounded conductive portions through the corresponding hollow portions, and the electromagnetic shielding layers are also grounded. After testing, it is found that the technical solution of the present disclosure can improve the anti-interference capability to external electromagnetic interference, and the flexible circuit board provided by the present disclosure can work normally in a harsher electromagnetic environment, so that the working reliability of a device connected to the flexible circuit board can be improved.

It should be noted that FIG. 1A and FIG. 1B are top-view structure schematic diagrams of the complete flexible circuit board, and the first hollow portions 41 in FIG. 1A and the second hollow portions 51 in FIG. 1B completely overlap. FIG. 3 and FIG. 5 are partial top-view structure schematic diagrams of two opposite surfaces of the flexible circuit board respectively, the first hollow portions 41 and the second hollow portions 51 in FIG. 3 are in one-to-one correspondence and only partially overlap, and one second hollow portion 51 and two first hollow portions 41 in FIG. 5 correspond to one another and only partially overlap.

During implementations, in the above flexible circuit board provided by the embodiments of the present disclosure, a material of the first conductive layer and the second conductive layer is generally copper foil. The copper foil is etched to form a trace area according to the arrangement of the traces, and the unetched copper foil is insulated from the traces and grounded.

During implementations, in the above flexible circuit board provided by the embodiments of the present disclosure, since the material of the first conductive layer and the second conductive layer is the copper foil, the function of the first cover film and the second cover film is to protect the copper foil from being exposed to the air, avoid oxidation of the copper foil, cover for subsequent surface treatments such as cover areas that do not require gold plating with the cover films, and play a role of solder resist in a subsequent surface mounting technology.

It should be noted that the first cover film covers the side of the first conductive layer facing away from the substrate layer as a whole face. The second cover film covers the side of the second conductive layer facing away from the substrate layer as a whole face. The plurality of first hollow portions are provided in an area of the first cover film corresponding to the first conductive portion, and the plurality of second hollow portions are provided in an area of the second cover film corresponding to the second conductive portion.

During implementations, in the above flexible circuit board provided by the embodiments of the present disclosure, the substrate layer may be a flexible resin layer, such as plastic base plates with excellent heat resistance and durability like polyimide, polyethylene terephthalate or polyethylene naphthalate.

During implementations, a material of the first cover film and the second cover film is generally made of polyimide.

It should be noted that the first electromagnetic shielding layer and the second electromagnetic shielding layer are to prevent signals transmitted in a signal line from radiating noise to the outside and to shield the external interference to the transmitted signals so as to improve the anti-interference capability.

During implementations, in the above flexible circuit board provided by the embodiments of the present disclosure, as shown in FIG. 2, FIG. 4 and FIG. 6, the orthographic projection of each first hollow portion 41 on the substrate layer 1 has an overlapping area with the orthographic projection of only one of the second hollow portions 51 on the substrate layer 1. When the structures shown in FIG. 2, FIG. 4 and FIG. 6 are adopted, it is found through actual verification tests that a design mode of the flexible circuit board provided by the present disclosure can improve the anti-interference capability to external electromagnetic interference, and an anti-interference test result will have the income of 2-3DB.

Figure 7:
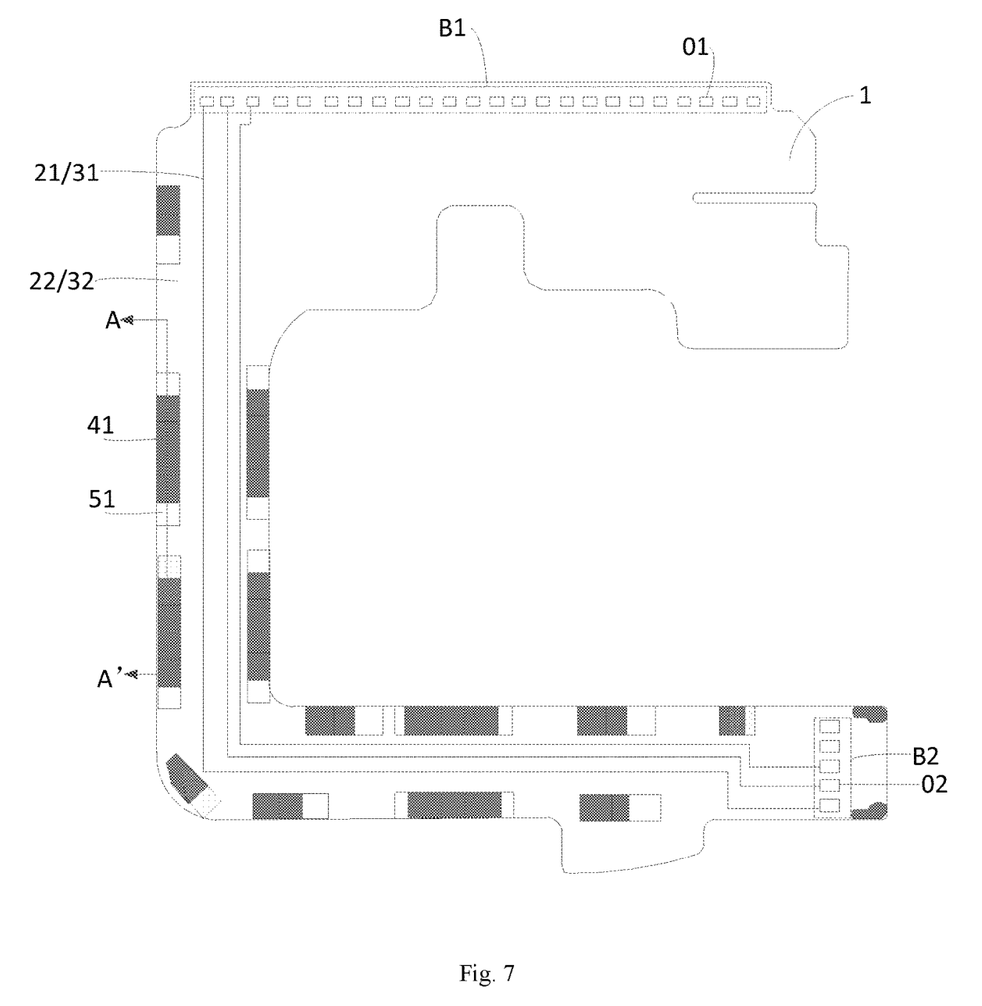
FIG. 7 is another top-view structure schematic diagram of a flexible circuit board provided by an embodiment of the present disclosure.
Figure 8:
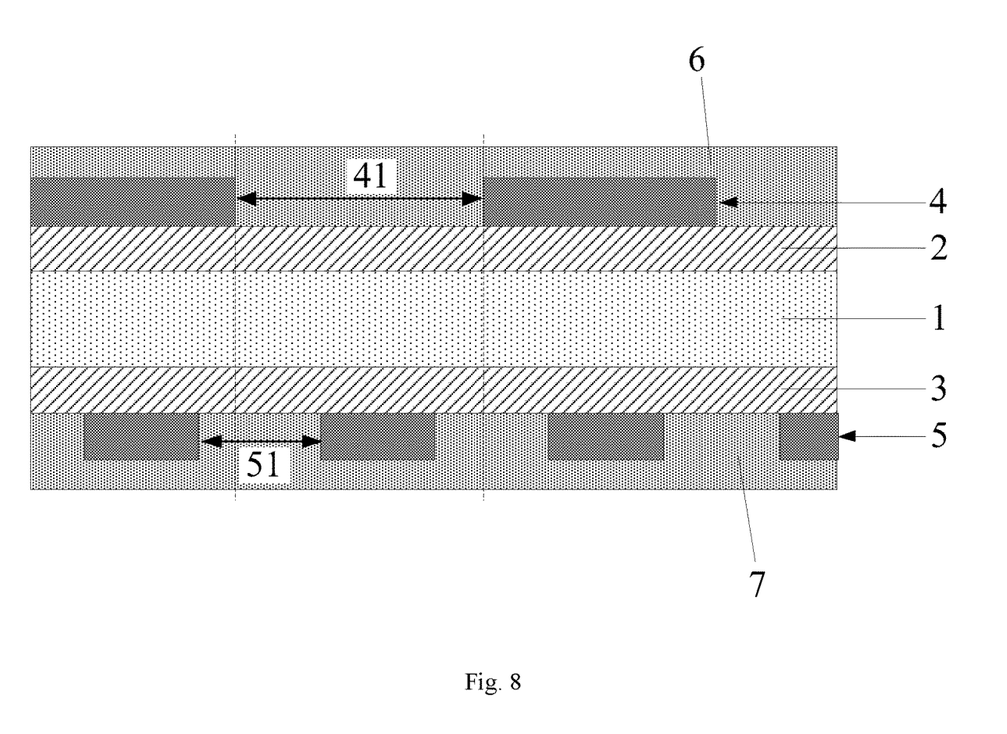
FIG. 8 is a sectional structure schematic diagram of FIG. 7 in an AA' direction.

FIG. 2, FIG. 4 and FIG. 6 adopt that the orthographic projection of each first hollow portion 41 on the substrate layer 1 has the overlapping area with the orthographic projection of only one of the second hollow portions 51 on the substrate layer 1. During implementations, the orthographic projection of each first hollow portion 41 on the substrate layer 1 may also have an overlapping area with the orthographic projections of two second hollow portions 51 on the substrate layer 1, as shown in FIG. 7 and FIG. 8. FIG. 7 is a top-view structure schematic diagram of the flexible circuit board. FIG. 8 is a sectional schematic diagram of FIG. 7 in an AA' direction. After testing, it is found that the structures of FIG. 7 and FIG. 8 also have better anti-interference capability to external electromagnetic interference.

During implementations, in the above flexible circuit board provided by the embodiments of the present disclosure, as shown in FIG. 5 and FIG. 6, the orthographic projection of at least one second hollow portion 51 on the substrate layer 1 has an overlapping area with the orthographic projections of two adjacent first hollow portions 41 on the substrate layer 1. After testing, it is found that the structure of FIG. 6 also has better anti-interference capability to external electromagnetic interference.

During implementations, in order to improve the anti-interference capability of the first electromagnetic shielding layer and the second electromagnetic shielding layer, in the above flexible circuit board provided by the embodiments of the present disclosure, as shown in FIG. 2 and FIG. 4, the first hollow portions 41 and the second hollow portions 51 are in one-to-one correspondence, in this way, the first electromagnetic shielding layer 6 is coupled to the grounded first conductive portion 22 through the first hollow portions 41, and the second electromagnetic shielding layer 7 is coupled to the grounded second conductive portion 32 through the second hollow portions 51, so that the electromagnetic anti-interference capability of the first electromagnetic shielding layer 6 and the second electromagnetic shielding layer 7 can be improved.

During implementations, in the above flexible circuit board provided by the embodiments of the present disclosure, as shown in FIG. 2, the orthographic projections of the first hollow portions 41 on the substrate layer 1 and the orthographic projections of the second hollow portions 51 on the substrate layer 1 completely overlap. After testing, it is found that the structure in FIG. 2 also has better anti-interference capability to external electromagnetic interference.

During implementations, since the flexible circuit board needs to be bent during use, and a thickness of the flexible circuit board corresponding to the hollow area is thinner than those of other areas, when adopting that the orthographic projections of the first hollow portions 41 on the substrate layer 1 and the orthographic projections of the second hollow portions 51 on the substrate layer 1 completely overlap in FIG. 2, an area of a thinner part (the hollow area) is larger, and the risk of breakage is likely to occur during bending, so in the above flexible circuit board provided by the embodiments of the present disclosure, as shown in FIG. 4, the orthographic projections of the first hollow portions 41 on the substrate layer 1 and the orthographic projections of the second hollow portions 51 on the substrate layer 1 only partially overlap. In this way, the area of the thinner part (the hollow area) is smaller, and the risk of breakage during bending is reduced. Therefore, the structure shown in FIG. 4 of the present disclosure can improve the anti-interference capability of the electromagnetic shielding layers on the basis of no breakage. The present disclosure preferably adopts the structure of FIG. 4.

It should be noted that, FIG. 2, FIG. 4, FIG. 6, and FIG. 8 of the embodiments of the present disclosure are only a few of illustrated implementations, of course, there may be other implementations, and as long as the first hollow portions and the first hollow portions have an overlapping area, they all belong to the protection content of the present disclosure, and are not listed here.

During implementations, in order to further improve the anti-interference capability of the electromagnetic shielding layers on the basis of no breakage, in the above flexible circuit board provided by the embodiments of the present disclosure, as shown in FIG. 4, FIG. 6 and FIG. 8, an area of the overlapping area where the first hollow portions 41 and the second hollow portions 51 overlap may account for 50% to 90% of an area of the orthographic projection of the second hollow portions 51 on the substrate layer 1. Preferably, the area of the overlapping area may account for 75% of the area of the orthographic projections of the second hollow portions 51 on the substrate layer 1.

During implementations, in the above flexible circuit board provided by the embodiments of the present disclosure, sizes of the first hollow portions and the second hollow portions may be the same. In this way, the plurality of first hollow portions and second hollow portions may be produced through one patterning process, and the production process is unified. During implementations, the sizes of the first hollow portions and the second hollow portions may also be different, and as long as the orthographic projections of the first hollow portions and the second hollow portions provided by the embodiments of the present disclosure have the overlapping area, the technical problems of the present disclosure can be solved.

During implementations, the embodiments of the present disclosure do not limit the sizes of the first hollow portions and the second hollow portions, for example, a length and a width of the hollow portions may be set according to actual needs.

In a possible implementation, in embodiments of the present disclosure, the length of the first hollow portion and the second hollow portion may be respectively 3 mm-5 mm, and the width of the first hollow portion and the second hollow portion may be respectively 0.5 mm-2 mm. Preferably, the length of the first hollow portion and the second hollow portion may be respectively 4 mm, and the width of the first hollow portion and the second hollow portion may be respectively 2 mm.

In a possible implementation, in embodiments of the present disclosure, a distance between adjacent first hollow portions may be 0.5 mm-2 mm, and a distance between adjacent second hollow portions may be 0.5 mm-2 mm. Preferably, the distance between the adjacent first hollow portions is 2 mm, and the distance between the adjacent second hollow portions is 2 mm.

During implementations, as shown in FIG. 1A and FIG. 1B, the design mode of the hollow portions in a dashed frame C in FIG. 1A and a dashed frame D in FIG. 1B is: one first hollow portion 41 correspondingly has an overlapping area with two second hollow portions 51. After testing, it is found that according to the hollow design mode of the dashed frame C and the dashed frame D in FIG. 1A and FIG. 1B, the anti-interference capability to external electromagnetic interference is better.

During implementations, in order to be able to set the first hollow portions and the second hollow portions that overlap in the same positions in the first cover film and the second cover film, in the above flexible circuit board provided by the embodiments of the present disclosure, as shown in FIG. 1A, FIG. 1B, FIG. 3, FIG. 5 and FIG. 7, the first conductive portion 22 surrounds all the first traces 21, and the second conductive portion 32 surrounds all the second traces 31. In this way, when etching the traces, the traces may be disposed as far as possible in a middle area of the flexible circuit board, and the first conductive part 21 and the second conductive part 31 are disposed in a peripheral area, so that the layout of the traces is facilitated, and in addition, the first hollow portions 41 and the second hollow portions 42 may be arranged regularly, so as to obtain the flexible circuit board with better anti-interference capability.

During implementations, in the above flexible circuit board provided by the embodiments of the present disclosure, as shown in FIG. 1A, FIG. 1B, FIG. 3, FIG. 5 and FIG. 7, an orthographic projection of the first conductive portion 22 on the substrate layer 1 coincides with an orthographic projection of the second conductive portion 32 on the substrate layer 1. In this way, the hollow portions may be disposed in areas, corresponding to the corresponding conductive portions, in the first cover film and the second cover film, thereby producing the flexible circuit board with better anti-interference capability.

During implementations, in the above flexible circuit board provided by the embodiments of the present disclosure, as shown in FIG. 1A, FIG. 1B, FIG. 3, FIG. 5 and FIG. 7, both the first conductive layer 2 and the second conductive layer 3 include first binding areas B1 and second binding areas B2. The first binding areas B1 have a plurality of first pads 01, the second binding areas B2 have a plurality of second pads 02, two ends of the first trace 21 are electrically connected with the corresponding first pad 01 and second pad 02 in the first conductive layer 2 respectively, and two ends of the second trace 31 are electrically connected with the corresponding first pad 01 and second pad 02 in the second conductive layer 3 respectively.

The respective first hollow portions 41 are arranged in an extending direction of the first trace 21, and the respective second hollow portions 51 are arranged in an extending direction of the second trace 31. In the electromagnetic anti-interference capability test, it is found that the anti-interference performance is better when the hollow portions are arranged in the extending direction of the trace.

During implementations, the first binding areas B1 are generally electrically connected with the signal line in a display device to provide signals to the signal line, the second binding areas B2 are generally connected with an external connector, and the external connector provides the traces with the signal output to the display device.

During implementations, in the above flexible circuit board provided by the embodiments of the present disclosure, as shown in FIG. 1A, FIG. 1B, FIG. 3, FIG. 5 and FIG. 7, the first hollow portion 41 is of a rectangular structure, and a width of the first hollow portion 41 in the extending direction of the first trace 21 is greater than a width of the first hollow portion 41 in a direction perpendicular to the extending direction of the first trace 21. In this way, an occupied area of the conductive portions can be reduced, so that more space is left on the surface of the substrate layer 1 for wiring.

During implementations, in the above flexible circuit board provided by the embodiments of the present disclosure, as shown in FIG. 1A, FIG. 1B, FIG. 3, FIG. 5 and FIG. 7, the first hollow portions 41 and the second hollow portions 51 of which the orthographic projections on the substrate layer 1 have the overlapping area are arranged in the extending direction of the first trace 21. In this way, the occupied area of the conductive portions can be further reduced, so that more space is left on the surface of the substrate layer 1 for wiring.

It should be noted that the present disclosure does not limit the thicknesses of the substrate layer, the first conductive layer, the second conductive layer, the first cover film, the second cover film, the first electromagnetic shielding layer and the second electromagnetic shielding layer.

During implementations, the above flexible circuit board provided by the embodiments of the present disclosure also includes other film layers such as adhesive layers and reinforcing layers, which are the same as those in the related art, and will not be described in detail here.

It should be noted that, since FIG. 1A, FIG. 1B, FIG. 3, FIG. 5 and FIG. 7 provided by the embodiments of the present disclosure only illustrate schematic diagrams of some film layer structures on the flexible circuit board, during implementations, other functional film layers well known to those skilled in the art can also be included, for example, structures such as components are disposed in blank areas of the upper parts in FIG. 1A, FIG. 1B, FIG. 3, FIG. 5 and FIG. 7.

Based on the same inventive concept, embodiments of the present disclosure further provide a method for preparing a flexible circuit board. Since the principle of solving the problem of the method is similar to the principle of solving the problem of the above flexible circuit board, the implementation of the method provided by the embodiments of the present disclosure may refer to the implementation of the above flexible circuit board provided by the embodiments of the present disclosure, and the repetition is not repeated.

Figure 9:
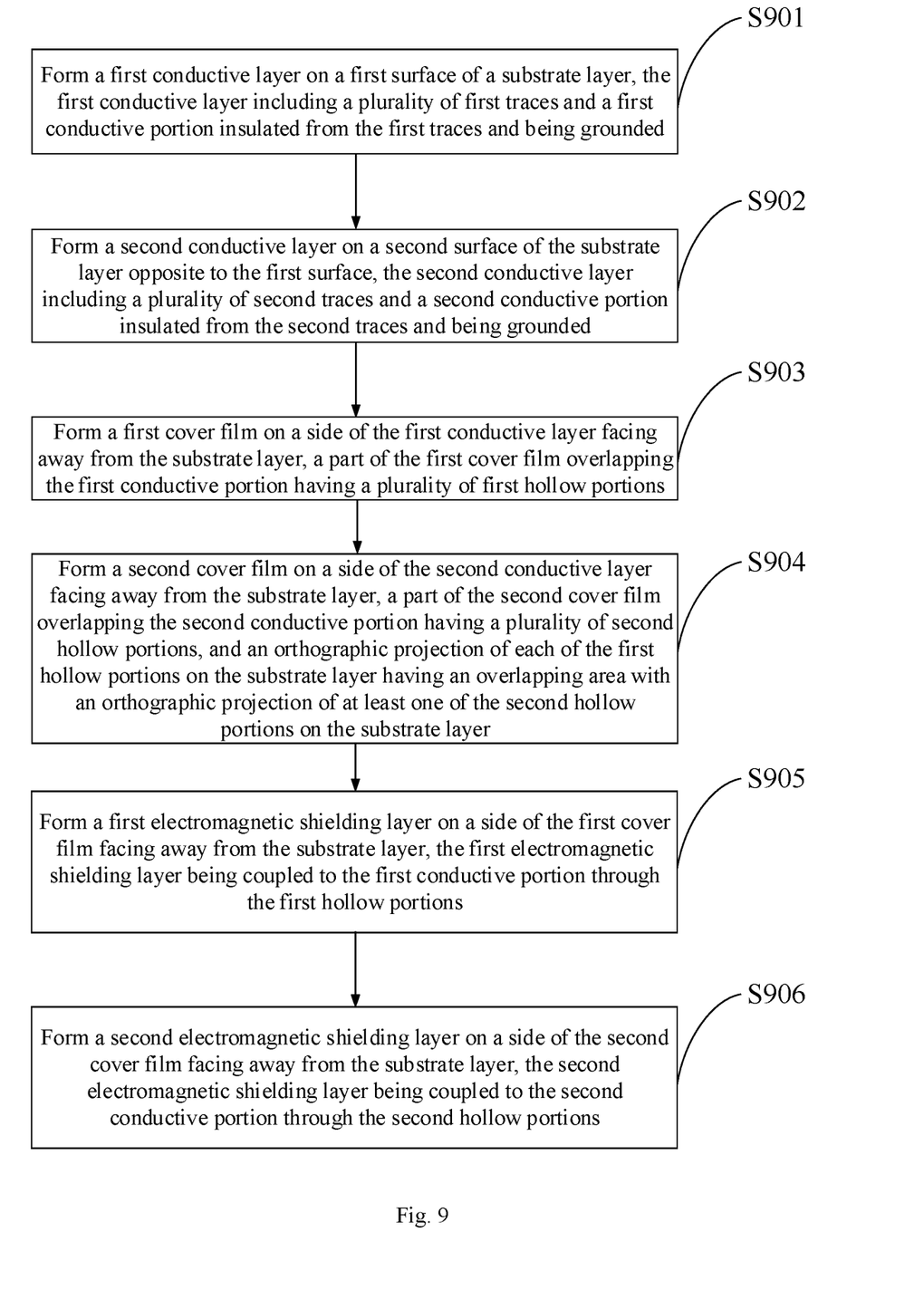
FIG. 9 is a flowchart of a method for preparing a flexible circuit board provided by an embodiment of the present disclosure.

The method for preparing the flexible circuit board according to the embodiments of the present disclosure, as shown in FIG. 9, includes the following steps.

S901, a first conductive layer is formed on a first surface of a substrate layer, the first conductive layer includes a plurality of first traces and a first conductive portion, and the first conduction portion is insulated from the first traces and is grounded.

S902, a second conductive layer is formed on a second surface of the substrate layer opposite to the first surface, the second conductive layer includes a plurality of second traces and a second conductive portion, and the second conductive portion is insulated from the second traces and is grounded.

S903, a first cover film is formed on a side of the first conductive layer facing away from the substrate layer, and a part of the first cover film overlapping the first conductive portion is provided with a plurality of first hollow portions.

S904, a second cover film is formed on a side of the second conductive layer facing away from the substrate layer, a part of the second cover film overlapping the second conductive portion is provided with a plurality of second hollow portions, and an orthographic projection of each of the first hollow portions on the substrate layer at least has an overlapping area with an orthographic projection of one of the second hollow portions on the substrate layer.

S905, a first electromagnetic shielding layer is formed on a side of the first cover film facing away from the substrate layer, and the first electromagnetic shielding layer is coupled to the first conductive portion through the first hollow portions.

S906, a second electromagnetic shielding layer is formed on a side of the second cover film facing away from the substrate layer, and the second electromagnetic shielding layer is coupled to the second conductive portion through the second hollow portions.

During implementation, the above method also includes the formation of other film layers such as adhesive layers and reinforcing layers, which are the same as those in the related art, and will not be described in detail here.

It should be noted that, in the above method provided by the embodiments of the present disclosure, a patterning process involved in forming each layer structure may not only include part or all of the processes like deposition, photoresist coating, mask masking, exposure, development, etching and photoresist stripping, and other processes may also be included, which are subject to the desired patterning pattern formed in the actual preparing process, which is not limited here. For example, a post-bake process may also be included after development and before etching.

The deposition process may be a chemical vapor deposition method, a plasma-enhanced chemical vapor deposition method, or a physical vapor deposition method, which is not limited here. A mask used in the masking process may be a Half Tone Mask, a Modifide Single Mask, a Single Slit Mask or a Gray Tone Mask, which is not limited here. The etching may be dry etching or wet etching, which is not limited here.

Based on the same inventive concept, embodiments of the present disclosure further provide an array substrate, including the above flexible circuit board provided by the embodiments of the present disclosure. Since the principle of solving the problem of the array substrate is similar to that of the above flexible circuit board, the implementation of the array substrate may refer to the implementation of the above flexible circuit board, and the repetition is not repeated.

Based on the same inventive concept, embodiments of the present disclosure further provide a display device, including the above array substrate provided by the embodiments of the present disclosure. Since the principle of solving the problem of the display device is similar to that of the above flexible circuit board, the implementation of the display device may refer to the implementation of the above flexible circuit board, and the repetition is not repeated.

During implementations, in the embodiments of the present disclosure, the display device may be any product or component with a display function, such as a mobile phone, a tablet computer, a television, a monitor, a notebook computer, a digital photo frame, and a navigator. Other essential components of the display device should be understood by those ordinarily skilled in the art, and will not be described in detail here, nor should it be regarded as a limitation of the present disclosure.

In the above flexible circuit board and the method for preparing the flexible circuit board, and the related device provided by the embodiments of the present disclosure, the plurality of first hollow portions are disposed in the part of the first cover film that overlaps the first conductive portion, the plurality of second hollow portions are disposed in the part of the second cover film that overlaps the second conductive portion, and the orthographic projection of each first hollow portion on the substrate layer at least has the overlapping area with the orthographic projection of one of the second hollow portions on the substrate layer. Therefore, by regularly opening the windows (making the hollow portions) in the first cover film and the second cover film, when the corresponding electromagnetic shielding layers are subsequently disposed on both sides of the first cover film and the second cover film, the electromagnetic shielding layers are electrically connected to the grounded conductive portions through the corresponding hollow portions, and as the conductive portions are grounded, the electromagnetic shielding layers are also grounded. After testing, it is found that the technical solution of the present disclosure can improve the anti-interference capability to external electromagnetic interference, and the flexible circuit board provided by the present disclosure can work normally in the harsher electromagnetic environment, so that the working reliability of the device connected to the flexible circuit board can be improved.

Although the preferred embodiments of the present disclosure have been described, additional variations and modifications may be made to these embodiments by those skilled in the art once the basic inventive concept is known. Therefore, it is intended that the appended claims be interpreted as including the preferred embodiments and all variations and modifications that fall within the scope of the present disclosure.

It will be apparent to those skilled in the art that various modifications and variations can be made in the embodiments of the present disclosure without departing from the spirit or scope of the embodiments of the present disclosure. Thus, if these modifications and variations of the embodiments of the present disclosure fall within the scope of the claims of the present disclosure and its equivalent technology, the present disclosure is also intended to include these modifications and variations.

What is claimed is:

1. A flexible circuit board, comprising:
   a substrate layer;
   a first conductive layer, located on a first surface of the substrate layer and comprising:
      a plurality of first traces; and
      a first conductive portion;
      wherein the first conductive portion is insulated from the first traces and is grounded;
   a second conductive layer, located on a second surface, opposite to the first surface, of the substrate layer and comprising:
      a plurality of second traces; and
      a second conductive portion;
      wherein the second conductive portion is insulated from the second traces and is grounded;
   a first cover film, located on a side of the first conductive layer facing away from the substrate layer, a part of the first cover film overlapping the first conductive portion being provided with:
      a plurality of first hollow portions;
   a second cover film, located on a side of the second conductive layer facing away from the substrate layer, a part of the second cover film overlapping the second conductive portion being provided with:
      a plurality of second hollow portions;
      wherein an orthographic projection of each of the first hollow portions on the substrate layer has an overlapping area with an orthographic projection of at least one of the second hollow portions on the substrate layer;
   a first electromagnetic shielding layer, located on a side of the first cover film facing away from the substrate layer, the first electromagnetic shielding layer being coupled to the first conductive portion through the first hollow portions; and
   a second electromagnetic shielding layer, located on a side of the second cover film facing away from the substrate layer, the second electromagnetic shielding layer being coupled to the second conductive portion through the second hollow portions.

2. The flexible circuit board according to claim 1, wherein the orthographic projection of at least one of the second hollow portions on the substrate layer has the overlapping area with the orthographic projection of two adjacent first hollow portions on the substrate layer.

3. The flexible circuit board according to claim 1, wherein the orthographic projection of each of the first hollow portions on the substrate layer has the overlapping area with the orthographic projection of only one of the second hollow portions on the substrate layer.

4. The flexible circuit board according to claim 3, wherein the first hollow portions correspond to the second hollow portions in a one-to-one mode.

5. The flexible circuit board according to claim 4, wherein orthographic projections of the first hollow portions on the substrate layer and orthographic projections of the second hollow portions on the substrate layer completely overlap.

6. The flexible circuit board according to claim 4, wherein orthographic projections of the first hollow portions on the substrate layer and orthographic projections of the second hollow portions on the substrate layer only partially overlap.

7. The flexible circuit board according to claim 4, wherein a size of the first hollow portion is same as a size of the second hollow portion.

8. The flexible circuit board according to claim 1, wherein an area of the overlapping area accounts for 50% to 90% of an area of the orthographic projection of the at least one second hollow portion on the substrate layer.

9. The flexible circuit board according to claim 1, wherein the first conductive portion surrounds all the first traces, and the second conductive portion surrounds all the second traces.

10. The flexible circuit board according to claim 9, wherein an orthographic projection of the first conductive portion on the substrate layer coincides with an orthographic projection of the second conductive portion on the substrate layer.

11. The flexible circuit board according to claim 1, wherein both the first conductive layer and the second conductive layer comprise first binding areas and second binding areas, the first binding areas are provided with a plurality of first pads, the second binding areas are provided with a plurality of second pads, two ends of the first trace are electrically connected with the corresponding first pad and second pad in the first conductive layer respectively, and two ends of the second trace are electrically connected with the corresponding first pad and second pad in the second conductive layer respectively;

wherein the respective first hollow portions are arranged in an extending direction of the first trace, and the respective second hollow portions are arranged in an extending direction of the second trace.

12. The flexible circuit board according to claim 11, wherein the first hollow portion is of a rectangular structure, and a width of the first hollow portion in the extending direction of the first trace is greater than a width of the first hollow portion in a direction perpendicular to the extending direction of the first trace.

13. The flexible circuit board according to claim 11, wherein the first hollow portions and the second hollow portions of which the orthographic projections on the substrate layer have the overlapping area are arranged in the extending direction of the first trace.

14. An array substrate, comprising the flexible circuit board according to claim 1.

15. A display device, comprising the array substrate according to claim 14.

16. A method for preparing a flexible circuit board, comprising:
    forming a first conductive layer on a first surface of a substrate layer, the first conductive layer comprising a plurality of first traces and a first conductive portion, and the first conductive portion being insulated from the first traces and being grounded;
    forming a second conductive layer on a second surface of the substrate layer opposite to the first surface, the second conductive layer comprising a plurality of second traces and a second conductive portion, and the second conductive portion being insulated from the second traces and being grounded;
    forming a first cover film on a side of the first conductive layer facing away from the substrate layer, a part of the first cover film overlapping the first conductive portion being provided with a plurality of first hollow portions;
    forming a second cover film on a side of the second conductive layer facing away from the substrate layer, a part of the second cover film overlapping the second conductive portion being provided with a plurality of second hollow portions; wherein an orthographic projection of each of the first hollow portions on the substrate layer has an overlapping area with an orthographic projection of at least one of the second hollow portions on the substrate layer;
    forming a first electromagnetic shielding layer on a side of the first cover film facing away from the substrate layer, the first electromagnetic shielding layer being coupled to the first conductive portion through the first hollow portions; and
    forming a second electromagnetic shielding layer on a side of the second cover film facing away from the substrate layer, the second electromagnetic shielding layer being coupled to the second conductive portion through the second hollow portions.

* * * * *